US008847328B1

(12) United States Patent
Laschek-Enders

(10) Patent No.: US 8,847,328 B1
(45) Date of Patent: Sep. 30, 2014

(54) MODULE AND ASSEMBLY WITH DUAL DC-LINKS FOR THREE-LEVEL NPC APPLICATIONS

(71) Applicant: Andreas Laschek-Enders, Bensheim (DE)

(72) Inventor: Andreas Laschek-Enders, Bensheim (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 13/791,906

(22) Filed: Mar. 8, 2013

(51) Int. Cl.
*H01L 27/088* (2006.01)
*H01L 29/739* (2006.01)
*H01L 23/00* (2006.01)

(52) U.S. Cl.
CPC ............ *H01L 29/7393* (2013.01); *H01L 24/96* (2013.01)
USPC .................... 257/401; 257/617; 257/E29.197

(58) Field of Classification Search
CPC ..... H01L 29/73; H01L 23/3107; H01L 25/07; H01L 25/071; H01L 25/072; H02M 1/32; H02M 2001/007; H02K 7/487
USPC .......... 257/618, 620, 401, 693, 565, E27.053, 257/E29.197, 378, E21.382, E21.383; 363/56.01, 137, 132, 58, 136, 89, 39, 363/40, 50, 131, 55
See application file for complete search history.

(56) References Cited

U.S. PATENT DOCUMENTS

| | | | | |
|---|---|---|---|---|
| 4,670,771 | A | 6/1987 | Neidig et al. | 357/74 |
| 6,084,788 | A | 7/2000 | Mizutani | 363/56 |
| 6,266,257 | B1 * | 7/2001 | Geissler | 363/56.05 |
| 6,930,899 | B2 * | 8/2005 | Bakran et al. | 363/132 |
| 2010/0254171 | A1 * | 10/2010 | Morishita et al. | 363/71 |
| 2011/0260545 | A1 * | 10/2011 | Asplund | 307/75 |

OTHER PUBLICATIONS

Frisch et al., "Advantages of NPC Inverter Topologies with Power Modules," Vincotech GmbH, Jul. 2009 (3 pages).
Frisch et al., "Power Module with Additional Low Inductive Current Path," Issue 7 2010 Power Electronics Europe, Power Modules pp. 22-27 www.vincotech.com (6 pages).
Frisch et al., "Asymmetrical Parasitic Inductance Utilized for Switching Loss Reduction," Issue 5 2012 Power Electronics Europe, Power Modules pp. 29-32 www.vincotech.com (4 pages).
Infineon F3L300R07PE4 IGBT-Module Technical Information, Infineon Technologies AG (1 page), Mar. 2, 2011.
Infineon EconoPACK 4 technical information, "The world standard for 3-level applications," Issue 2 Mar. 2012 Power Electronics Europe www.infineon.com/highpower (2 pages).

(Continued)

*Primary Examiner* — Cuong Q Nguyen
*Assistant Examiner* — Yosef Gebreyesus
(74) *Attorney, Agent, or Firm* — Imperium Patent Works; T. Lester Wallace

(57) ABSTRACT

A power semiconductor module has four power terminals. An IGBT has a collector connected to the first power terminal and an emitter coupled to the third power terminal. An anti-parallel diode is coupled in parallel with the IGBT. A DC-link is connected between the second and fourth power terminals. The DC-link may involve two diodes and two IGBTs, where the IGBTs are connected in a common collector configuration. The first and second power terminals are disposed in a first line along one side of the module, and the third and fourth power terminals are disposed in a second line along the opposite side of the module. Two identical instances of the module can be interconnected together to form a three-level NPC phase leg having low stray inductances, where the phase leg has two parallel DC-links.

17 Claims, 14 Drawing Sheets

(56) References Cited

OTHER PUBLICATIONS

Nabae et al., "A New Neutral-Point-Clamped PWM Inverter," IEEE Transactions on Industry Applications, vol. 1A-17, No. 5, Sep./Oct. 1981, 0093-0094/81/0900-0518 1981 IEEE pp. 518-523 (6 pages).

Schweizer et al., "Comparison of the Chip Area Usage of 2-level and 3-level Voltage Source Converter Topologies," Power Electronic Systems Laboratory, Zurich, 978-1-4244-5226-2/10 2010 IEEE pp. 391-396 (6 pages).

Xi et al., "IGBT power modules utilizing new 650V IGBT and Emitter Controlled Diode chips for three level converter," Infineon Technologies AG (No Date) (6 pages), 2009.

* cited by examiner

NPC MODULE

NPC MODULE

ONE DBC SUBSTRATE ASSEMBLY

FIG. 11

| | T0-T1 | | | | T1-T2 | | | | T2-T3 | | | | T3-T4 | | | |
|---|---|---|---|---|---|---|---|---|---|---|---|---|---|---|---|---|
| | FIG.12A | FIG.12B | FIG.12C | FIG.12D | FIG.13A | FIG.13B | FIG.13C | FIG.13D | FIG.14A | FIG.14B | FIG.14C | FIG.14D | FIG.15A | FIG.15B | FIG.15C | FIG.15D |
| T1 CURRENT | N | N | N | N | Y | N | N | N | N | N | N | N | N | N | N | N |
| T1 ON/OFF | ON | OFF | OFF | OFF | ON | OFF | OFF | OFF | OFF | OFF | OFF | OFF | OFF | OFF | OFF | OFF |
| D1 CURRENT | Y | Y | N | OFF | N | N | N | OFF | N | N | N | OFF | N | N | N | OFF |
| T2 CURRENT | N | N | N | Y | N | Y | Y | N | N | N | Y | N | N | N | N | N |
| T2 ON/OFF | ON | ON | ON | N | ON | ON | ON | ON | OFF | OFF | ON | OFF | OFF | OFF | OFF | OFF |
| D2 CURRENT | N | N | Y | N | N | N | N | N | N | N | N | N | N | N | N | N |
| T3 CURRENT | N | N | Y | N | N | N | N | N | N | N | N | N | N | Y | Y | Y |
| T3 ON/OFF | OFF | OFF | ON | OFF | OFF | OFF | ON | OFF | ON | ON | ON | ON | ON | ON | ON | ON |
| D3 CURRENT | N | N | N | N | N | Y | Y | Y | N | N | Y | N | N | N | N | N |
| T4 CURRENT | N | N | N | N | N | N | N | N | N | N | N | N | Y | N | N | N |
| T4 ON/OFF | OFF | OFF | OFF | OFF | OFF | OFF | OFF | OFF | ON | OFF | OFF | OFF | ON | OFF | OFF | OFF |
| D4 CURRENT | N | N | N | N | N | N | N | N | Y | Y | N | Y | N | N | N | N |

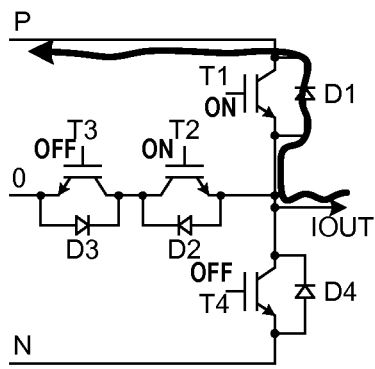
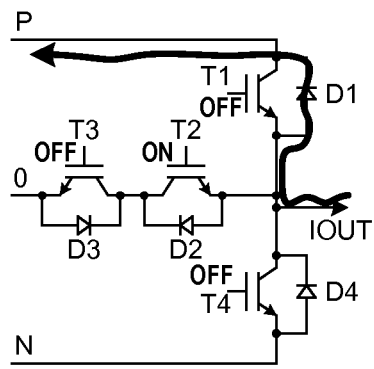
FIG. 12A  FIG. 12B
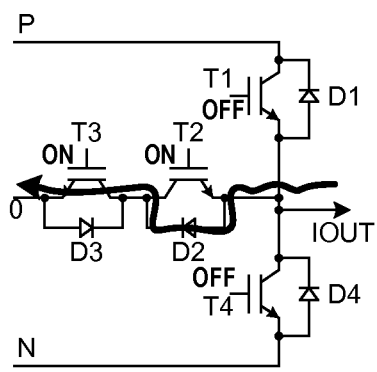
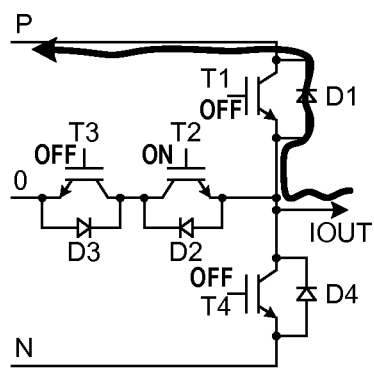
FIG. 12C  FIG. 12D

MODULE AND ASSEMBLY WITH DUAL DC-LINKS FOR THREE-LEVEL NPC APPLICATIONS

TECHNICAL FIELD

The described embodiments relate to power semiconductor modules usable in three-level NPC phase leg applications.

BACKGROUND INFORMATION

FIG. 1 (Prior Art) is a diagram of a T-type three-level Neutral-Point-Clamped (NPC) phase leg module 1. Such a module sees use in applications including solar inverter, motor drive and UPS applications. The module is referred to as a "three-level" module because the module couples an output node AC to a selected one of three DC voltage power terminals. As compared to conventional two-level topologies, a T-type three-level topology may provide advantages in a given application. For example, a T-type three-level topology may allow transistors within the module to have lower breakdown voltages than they would otherwise be required to have were a two-level topology used, with the added advantages of better conduction and switching performance resulting in lower losses. Also a T-type three-level topology may allow a motor to be driven while emitting a reduced amount of electromagnetic energy. When the module is performing its switching function, the amount of emitted electromagnetic radiation generally must be below an allowable limit. The three-level topology may reduce the cost of filtering necessary to reduce emitted electromagnetic energy so that it will be below the allowable limit.

The constituent transistors, diodes and other components of a T-type three-level NPC phase leg circuit can be provided in different types of packages. In a low power application, a T-type three-level NPC phase leg circuit may be realized in one power module package. In a higher power application, a T-type three-level NPC phase leg circuit may have to be realized in multiple module packages due to heat dissipation limitations of a single module package and due to a lack of mounting area because of the required die size for the high current.

FIG. 1 is a top-down diagram of a T-type three-level NPC phase leg circuit that is realized in a single power module package. The module 1 includes an injected molded plastic housing 2 that is formed around a metal base plate. Four power terminals 3-6 extends outward from the housing 2 as illustrated. The power terminals are standard screw terminals for making electrical connections of bus bars or wires. The bottom side of the module can be attached to a heatsink or other body via screws (not shown). The screws are made to extend through corresponding mounting holes 7-10 in mounting flaps of the housing so that the screw heads hold the bottom side of the module (the metal base plate) down onto the heatsink. In addition to the four power terminals, there are smaller upwardly extending signaling/control terminals. The smaller upwardly extending signaling/control terminals are disposed in two rows. These upwardly extending signaling/control terminals extend upward out of the upper surface of the plastic housing. One of these signaling/control terminals of the upper row is identified with reference numeral 11.

FIG. 2 (Prior Art) is a circuit diagram of the T-type three-level NPC phase leg circuit of module 1 of FIG. 1. The circuit includes four Insulated Gate Bipolar Transistors (IGBT) 12-15 and four fast recovery diodes 16-19. IGBTs 14, 15 and diodes 18 and 19 are sometimes referred to as the DC-link. A positive DC voltage is generally supplied onto the P power terminal 3. A negative DC voltage is generally supplied onto the N power terminal 4. Ground potential (zero volts) is generally supplied onto the 0 neutral power terminal 6. In operation, current can be conducted from the P power terminal 3 to the output AC output terminal 5 by making IGBT 12 conductive. Current can be drawn from the AC output terminal to the N power terminal 4 by making IGBT 13 conductive. The AC output terminal 5 can be coupled to ground potential by making the DC-link conductive. The average current supplied out of the module via the AC output terminal to a load, or received onto the module via the AC output terminal from the load, is controlled by pulse-width modulating the IGBT gate signals of the various IGBTs of the module.

There are many considerations involved in the design of three-level NPC phase leg circuits, including the reduction of stray inductances. For additional background information, see, for example: 1) A New Neutral-Point-Clamps PWM Inverter, by Akira Nabae et al., IEEE Transactions on Industry Applications, Vol. IA-17, No. 5, pages 518-523 (1981); 2) Comparison of the Chip Area Usage of 2-Level and 3-Level Voltage Source Converter Technologies, by Mario Schweizer et al., Proceedings of the $36^{th}$ Annual IEEE Industrial Electronics Society Conference, pages 391-396 (2010); 3) IGBT Power Modules Utilizing New 650VV IGBT and Emitter-Controlled Diode Chips For Three Level Converter, by Zhang Xi et al., Proceedings of the PCIM Europe 2009 Conference, pages 117-122 (2009); 4) Advantages of NPC Inverter Topologies With Power Modules, by Michael Frisch et al., www.Vincotech.com, 3 pages (2009); and 5) Power Module With Additional Low Inductive Current Path, Michael Frisch et al., 2010 Power Electronics Europe, Issue 7, pages 22-27 (2010).

SUMMARY

A power semiconductor module has four power terminals. Each power terminal has a fastening hole. The fastening hole may have threads or a nut to engage the threads of a screw. An injection molded plastic housing of the module has an enclosure portion and it extends around a metal base plate. The metal base plate forms the bottom surface of the enclosure. An IGBT has a collector connected to the first power terminal and an emitter coupled to the third power terminal. A fast recovery diode is coupled anti-parallel with the IGBT such that the diode anode is coupled to the emitter and the diode cathode is coupled to the collector. A DC-link is connected between the second and fourth power terminals. The DC-link may involve two diodes and two IGBTs, where the IGBTs are connected in a common collector or a common emitter configuration. Each IGBT of the DC-link has its own anti-parallel fast recovery diode. The IGBT, the diode, and the DC-link are disposed on a substrate such, for example, as a Direct Bonded Copper (DBC) or Direct Bonded Aluminum (DBA) ceramic substrate. The resulting substrate assembly is encapsulated in the enclosure portion of the housing of the module so that the bottom surface of the DBA substrate is in good thermal contact with the upper surface of the metal base plate of the enclosure.

In one example, the first and second power terminals are disposed in a first line along one side of the module. The third and fourth power terminals are disposed in a second line along the opposite side of the module. The first and second lines extend parallel to one another. The first power terminal and the third power terminal are disposed along a third line, and the third line extends perpendicularly to the first line. Axes of the four fastening holes of the four power terminals define a rectangle.

In one application, by turning a first such module one-hundred eighty degrees with respect to a second identical module, and by connecting the two modules together with metal bus bars, two identical instances of the module are interconnected to form a three-level NPC phase leg that exhibits low stray inductances. The three-level NPC phase leg involves two DC-links that are connected together in parallel. By splitting the circuitry of a T-type three-level NPC circuit into two identical halves, each of which includes a separate DC-link, and by providing the AC power terminal of the DC-link (the fourth power terminal) close to the AC power terminal of the main IGBT (the third power terminal) in each module, the area enclosed by main conduction and commutation current loops is reduced as compared to other multi-module realizations of the T-type three-level NPC circuit. Due to the smaller current loops, stray inductances are reduced as compared to stray inductances in a multi-module realization that provides the DC-link and the main IGBTs in different modules. The use of two identical modules to realize the T-type three-level NPC phase leg circuit, as compared to realizing the T-type three-level NPC phase leg circuit using different types of modules, is advantageous in that fewer module types may be manufactured and stocked. Higher manufacturing quantities of one module type helps reduce a module unit manufacturing cost for overall the phase leg circuit. In addition, the novel module may be used in power circuits other than in a T-type three-level NPC phase leg. Due to the use of the two parallel-connected DC-links in the three-level NPC circuit, power dissipation of the DC-link is spread over two modules as opposed to all be located in one module. Snubber circuits are therefore not necessary in some applications to spread power losses, whereas if a single DC-link were used in a standard module package then such snubber circuits would typically be required.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 11 is a table that illustrates current flow and IGBT operation in one of the phase legs of the system of FIG. 9.

FIGS. 12A-12D are diagrams that illustrate how a phase leg of the system of FIG. 9 operates during time period T0-T1.

DETAILED DESCRIPTION

Reference will now be made in detail to embodiments of the invention, examples of which are illustrated in the accompanying drawings.

Figure 1:
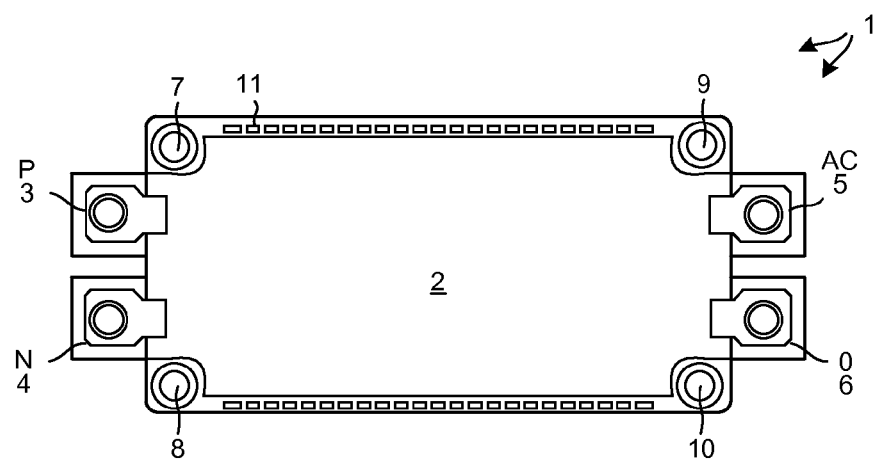
FIG. 1 (Prior Art) is a top-down diagram of a T-type NPC power module.
Figure 2:
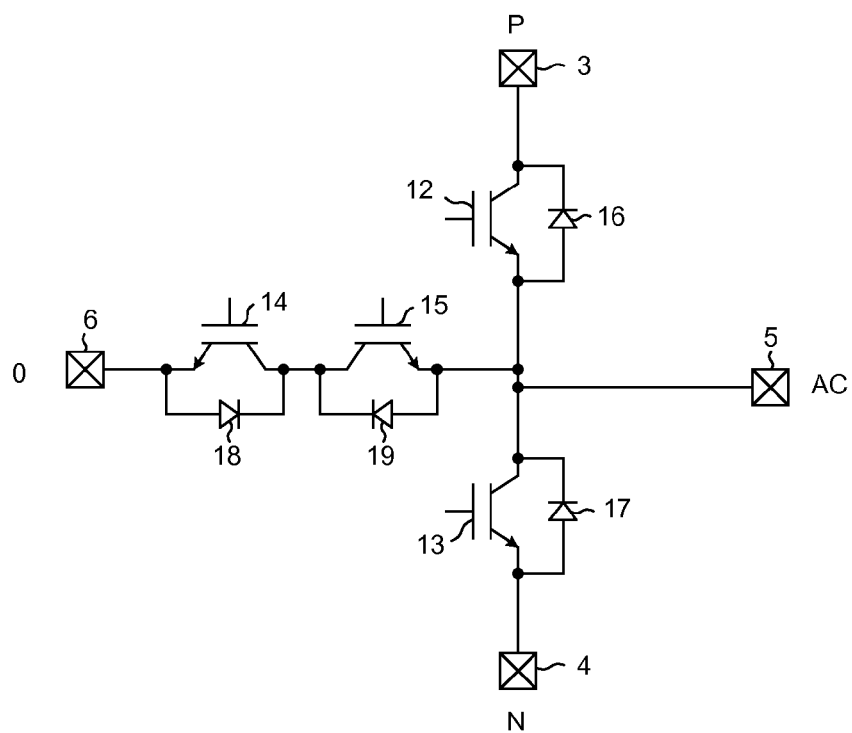
FIG. 2 (Prior Art) is a circuit diagram of the circuit within the T-type NPC power module of FIG. 1.
Figure 3:
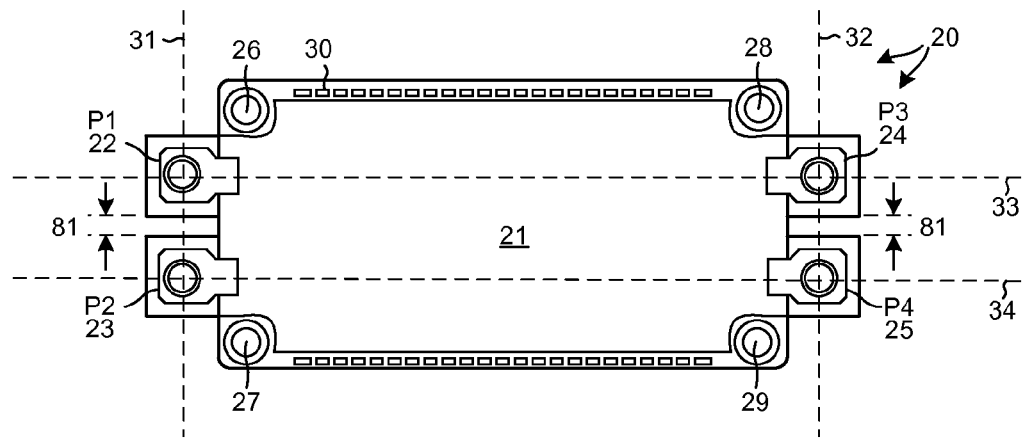
FIG. 3 is a top-down diagram of a power module 20 in accordance with one novel aspect.

FIG. 3 is a top-down diagram of a power semiconductor NPC module 20. The module 20 includes an injected molded plastic housing 21 having a central tray-shaped enclosure portion and four laterally-extending tab-like extension portions. The plastic housing 21 extends around a metal base plate that forms the bottom of the central enclosure portion. A cap or lid is provided to cap the central enclosure portion. The cap provides mechanical strength. Four power terminals 22-25 extends outward from the housing 21 as illustrated. The power terminals are standard screw terminals for attachment to electrical bus bars or wires. Each power terminal has a threaded fastening hole or a nut for engaging the threads of a screw. The housing 21 can be attached to a heatsink via screws (not shown) so that the metal base plate is in good thermal contact with the heatsink. The screws are made to extend through corresponding mounting holes 26-29 in a mounting flap of the housing so that the screws head hold the module 20 down onto the heatsink. In the particular embodiment illustrated, the module has four and no more than four power terminals. In addition to the four power terminals, there are smaller upwardly extending signaling/control terminals disposed in two rows. These smaller upwardly extending signaling/control terminals extend upward out of the upper surface of the plastic housing. One of these signaling/control terminals of the upper row is identified with reference numeral 30.

The first P1 power terminal 22 and the second P2 power terminal 23 are disposed along a first line 31. The third P3 power terminal 24 and the fourth P4 power terminal P4 are disposed along a second line 32. The first P1 power terminal 21 and the third P3 power terminal 24 are disposed along a third line 33. The second P2 power terminal 23 and the fourth P4 power terminal 25 are disposed along a fourth line 34. Lines 31 and 32 are parallel to one another and lines 33 and 34 are parallel to one another. Line 33 is perpendicular to lines 31 and 32 as illustrated. The axes of the fastening holes of the four power terminal define the corners of a rectangle.

Figure 4:
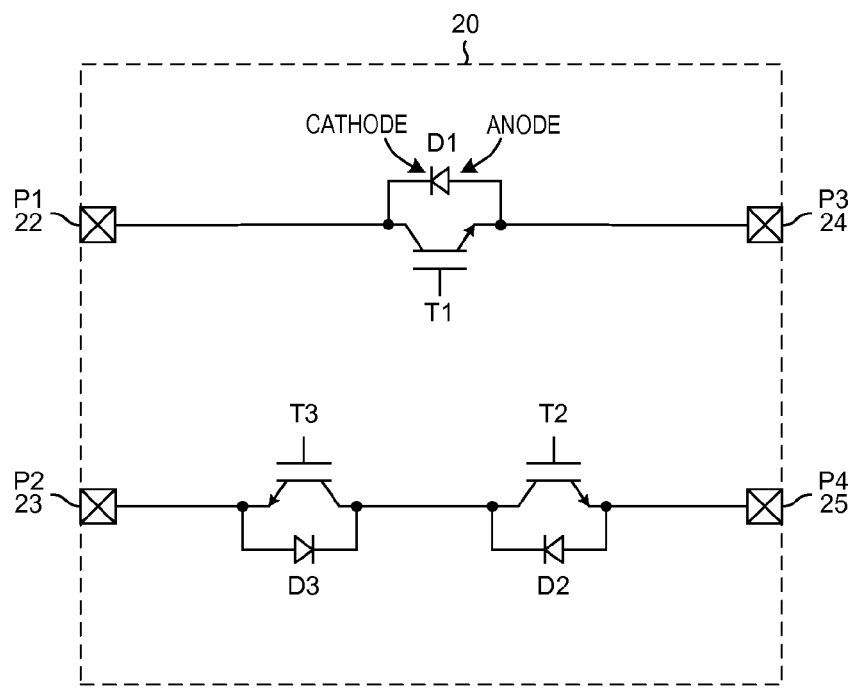
FIG. 4 is a circuit diagram of the circuit within the power module 20 of FIG. 3.

FIG. 4 is a circuit diagram of the circuit within module 20. The circuit includes three IGBTs T1-T3 and three fast recovery anti-parallel diodes D1-D3. The anode of diode D1 is connected to the emitter of IGBT T1 and the cathode of diode D1 is connected to the collector of IGBT T1. The collector of IGBT T1 is connected to the P1 power terminal 22. The emitter of IGBT T1 is connected to the P3 power terminal 24. IGBTs T2 and T3 and diodes D2 and D3 form a DC-link. The DC-link is coupled between the P2 power terminal 23 and the P4 power terminal 25. The common collector connection of IGBTs T2 and T3 makes it possible to attach IGBTs, via their backside collectors, onto a single conductive pad or substrate.

Although the each of the IGBTs T1, T2 and T3 is illustrated as a single IGBT symbol, each of the IGBTs is realized as a plurality of parallel-connected IGBT dice. Similarly, although each of the diodes D1, D2 and D3 is illustrated as a single diode symbol, each of the diodes D1, D2 and D3 is realized as a plurality of parallel-connected diode dice. The IGBT dice and the diode dice are mounted onto one or more substrates, and the substrates are disposed in the enclosure portion of the module so that the bottom of the substrates are in good thermal contact with the metal base plate of the enclosure. The substrates may, for example, be DBC (Direct Bonded Copper) or DBA (Direct Bonded Aluminum) substrates. There are also module constructions that do not have a metal base plates but rather have DBC or DBA for thermal conduction out of the package.

Any current flow between power terminals P1 and P3 is substantially parallel to any current flow between power terminals P2 and P3. In addition, the distance of separation 81 between power terminals P3 and P4 and between power terminal P1 and P2 is the smallest separation permitted between power terminals for the design and voltage conditions of the application. There are no other terminals between P3 and P4. There are no other terminals between P1 and P2.

Figure 5:
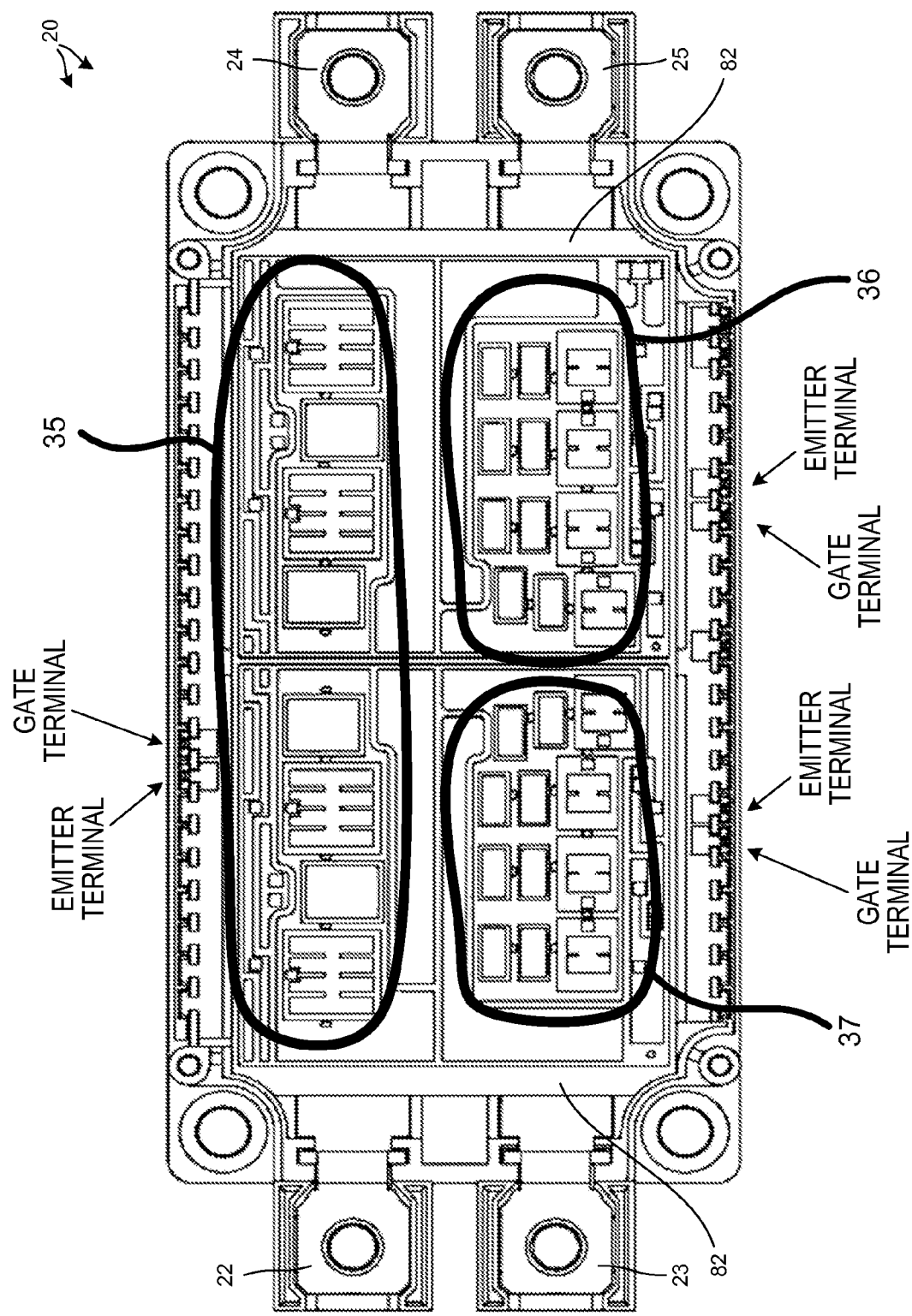
FIG. 5 is a top-down diagram of the power module 20 of FIG. 3 with its cap removed, and not showing bond wires or semiconductor topside connections

FIG. 5 is a more detailed top-down diagram of module 20 with its enclosure cap removed so that the circuitry within the enclosure portion can be seen shown without bond wires. Reference numeral 82 identifies the metal base plate that forms the heat conductive bottom of the enclosure. In the diagram, heavy loop 35 encircles the circuit components that together comprise IGBT T1 and diode D1. IGBT T1 is realized as four parallel-connected IGBT dice. Diode D1 is realized as four parallel-connected diode dice. Heavy loop 36 encircles the circuit components that together comprise IGBT T2 and diode D2. IGBT T2 is realized as four parallel-connected IGBT dice. Diode D2 is realized as eight parallel-connected diode dice. Heavy loop 37 encircles the circuit components that together comprise IGBT T3 and diode D3. IGBT T3 is realized as four parallel-connected IGBT dice. Diode D3 is realized as eight parallel-connected diode dice. The components are mounted (for example, by soft soldering) as illustrated on two DBC substrates. Each of the two DBC substrates appears as a square when viewed from the top-down perspective of FIG. 5. The two squares are disposed side-by-side when viewed from the perspective of FIG. 5. The two DBCs are interconnected via bond wires or equivalent connecting techniques. Bond wires also connect the DBC assemblies to the power terminals and to various ones of the signaling/control terminals. The bottom surfaces of the two DBCs are in good physical and thermal contact with the upper surface of the metal base plate that forms the bottom of the enclosure.

Figure 6:
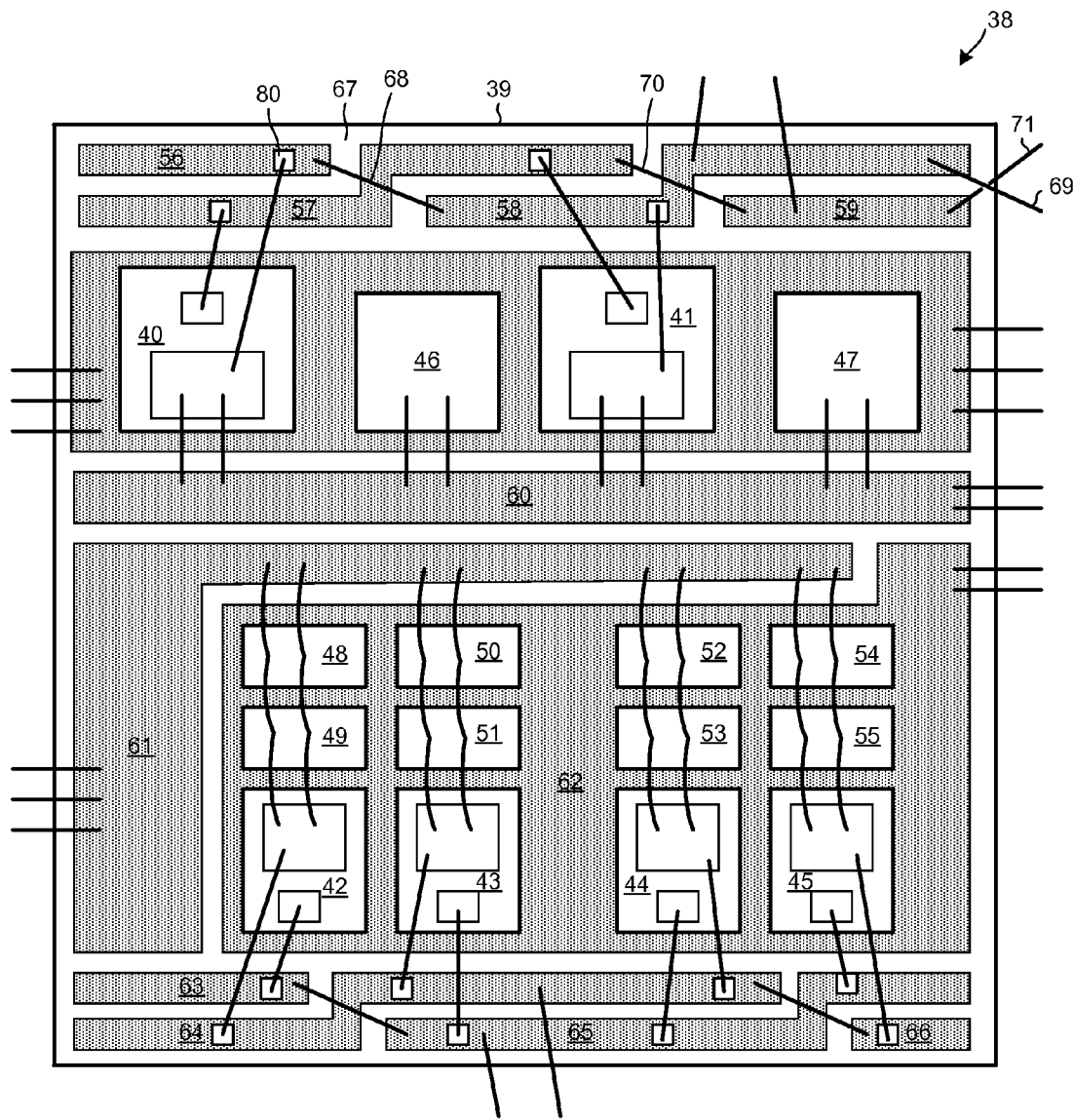
FIG. 6 is a top-down diagram of one of the two DBC substrate (which are not identical) assemblies in the power module 20 of FIG. 3.

FIG. 6 is a top-down diagram of the leftmost DBC assembly 38 of FIG. 5. The rightmost DBC assembly is connected in a fashion that mirrors the connections of the leftmost DBC. FIG. 6 is simplified, and is not an exact diagram of the DBC assembly 38, but the drawing does illustrate the major features of interest. As shown in FIG. 6, DBC assembly 38 includes the leftmost DBC substrate 39, six IGBT dice 40-45, and ten diode dice 46-55. Patterned areas 56-66 of a copper layer are disposed on the square-shaped insulating ceramic layer 67. A first conductive connection includes conductive area 56, wire bond 68, conductive area 58, wire bond 69, and other parts on the rightmost DBC (not shown). A second conductive connection includes conductive area 57, wire bond 70, conductive area 59, wire bond 71, and other parts on the rightmost DBC (not shown). The wire bonds are lengths of typically 300 up to 500 μm diameter aluminum wire. The first conductive connection is coupled to the emitters of IGBT dice 40 and 41, as well as to the emitters of the IGBT dice of the rightmost DBC (not shown) that make up main IGBT T1. The second conductive connection is coupled to the gates of IGBT dice 40 and 41, as well as to the gates of the IGBT dice of the rightmost DBC that make up IGBT T1. These first and second conductive connections extend horizontally across the module in the twisted fashion illustrated. The first conductive connection bridges over the second conductive connection at wire bonds 68 and 69. The second conductive connection bridges over the first conductive connection at wire bond 70 and 71. The twisting reduces line impedance in the first and second conductive connections and reduces induced voltages by the magnetic field of high currents paths. In a similar way to the way the first and second conductive connections are twisted, the conductive connections extending to the gates and emitters of IGBT dice 42-45 are also twisted with respect to one another as illustrated in FIG. 6.

Rather than the gates and emitters of the IGBT dice being directly connected to the first and second conductive connections (the twisted conductive connections), in some embodiments each gate and emitter is connected via a separate surface mount resistor. For example, reference numeral 80 identifies one such resistor die. The bottom surface of resistor die 80 is in contact with the underlying metal of area 56, whereas the top surface of the resistor die 80 makes contact with the wire bond that extends to the emitter of IGBT die 40. The resistor dice dampen ground loop effects and facilitate paralleling of power dice.

Figure 7:
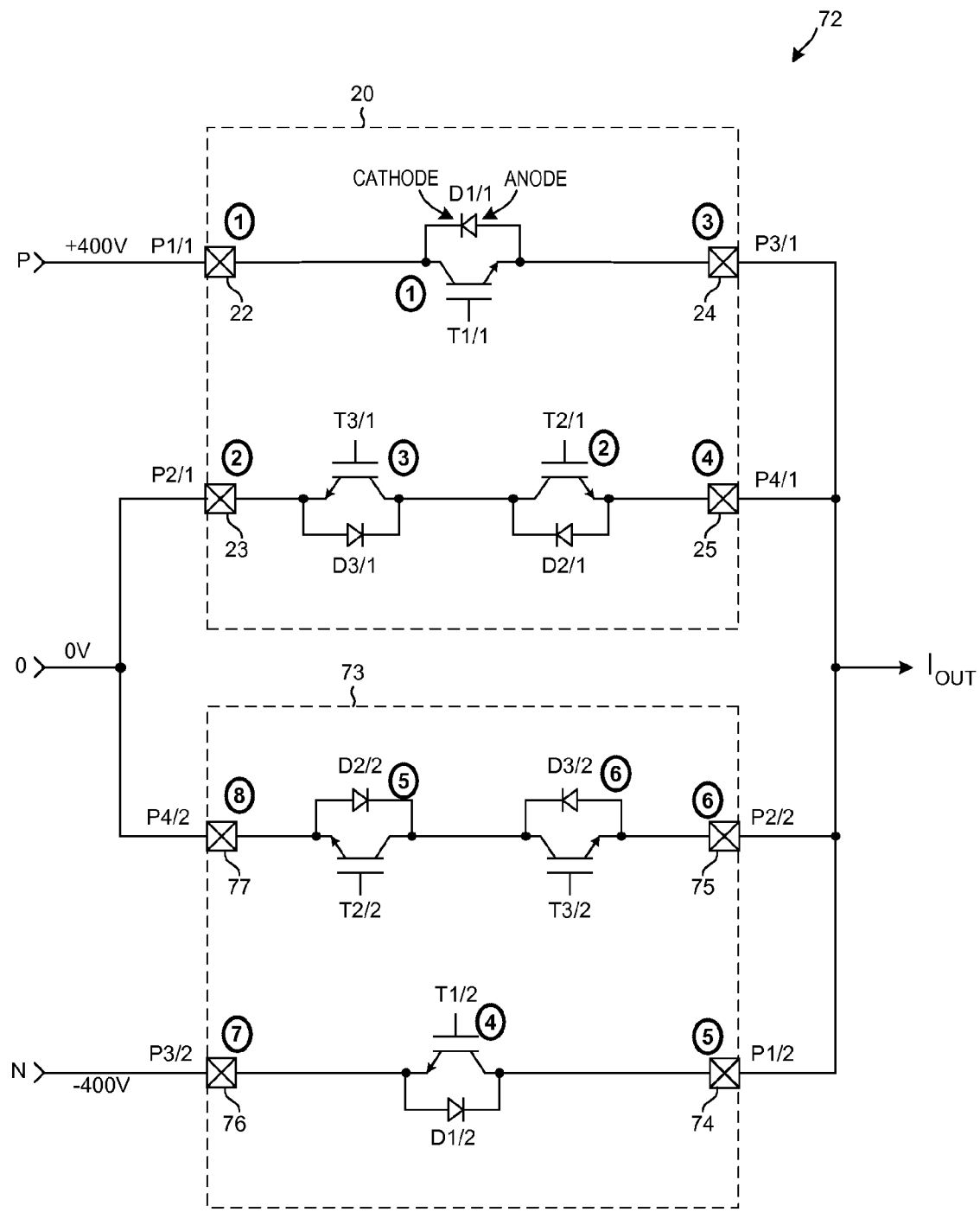
FIG. 7 is a circuit diagram of a three-level NPC phase leg circuit that comprises two instances of the power module of FIG. 3.

FIG. 7 is a circuit diagram of a T-type three-level NPC phase leg circuit 72 that involves module 20 as well as a second module 73 that is of identical construction to module 20. The P3 power terminal 24 of module 20 is coupled to the P4 power terminal 25 of module 20 and to the P1 power terminal 74 of module 73 and to the P2 power terminal 75 of module 73. This common node is the $I_{OUT}$ node of the circuit. The P2 power terminal 23 of module 20 is coupled to the P4 power terminal 77 of module 73. This common node is a "0V" node of the circuit. A DC voltage source supplies a positive DC voltage, for example +400V, onto the P1 power terminal 22 of module 20. A DC voltage source supplies ground potential (zero volts relative to the positive DC voltage on terminal 22) onto the "0V" node. A DC voltage source supplies a negative DC voltage, for example −400V, onto the P3 power terminal 76 of module 73. Connections to the signaling/control terminals of the modules 20 and 73 are not shown.

Figure 8:
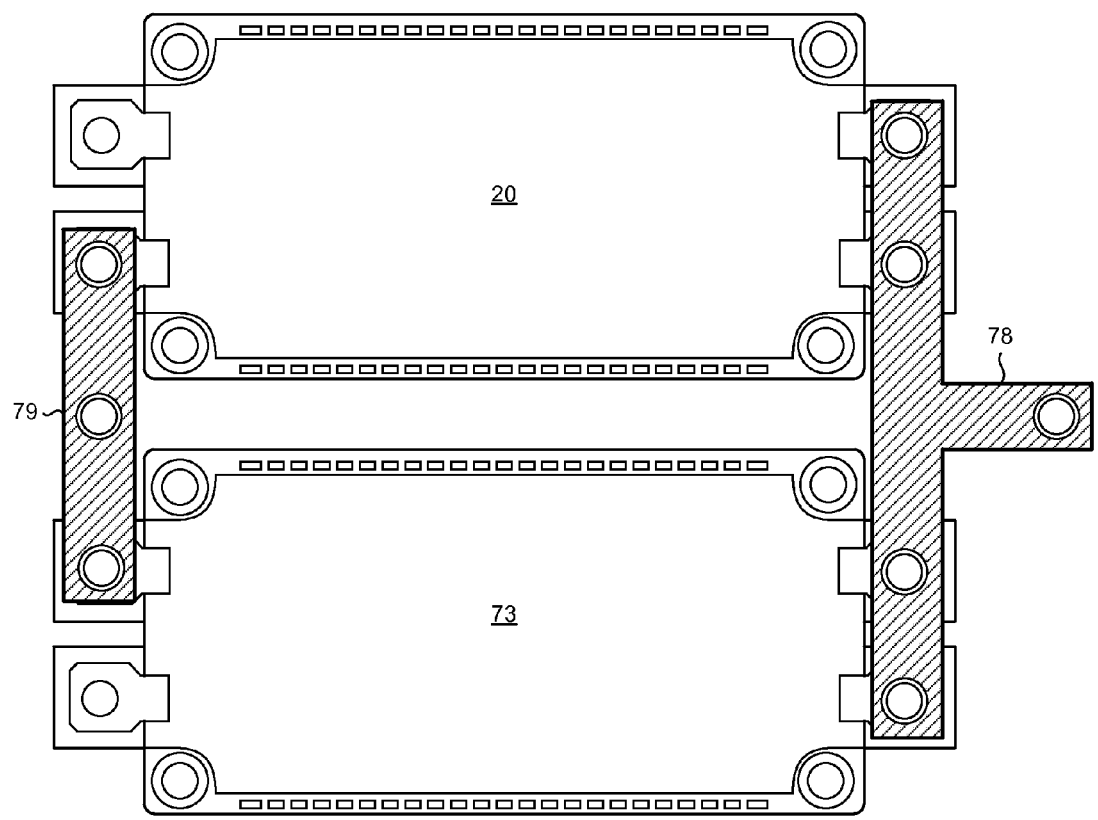
FIG. 8 is a top-down diagram of a physical implementation of the circuit of FIG. 7.

FIG. 8 is a top-down diagram that shows the modules 20 and 73 of the circuit illustrated in FIG. 7. The $I_{OUT}$ output node of the circuit of FIG. 7 is provided by a first T-shaped copper bus bar 78. First bus bar 78 has holes that align with the fastening holes in power terminals 24 and 25 of module 20 and with the fastening holes in power terminals 74 and 75 of module 73. The "0V" node of the circuit of FIG. 7 is provided by a second bus bar 79. Second bus bar 79 has holes that align with the fastening holes in power terminal 23 of module 20 and power terminal 77 of module 73.

Figure 9:
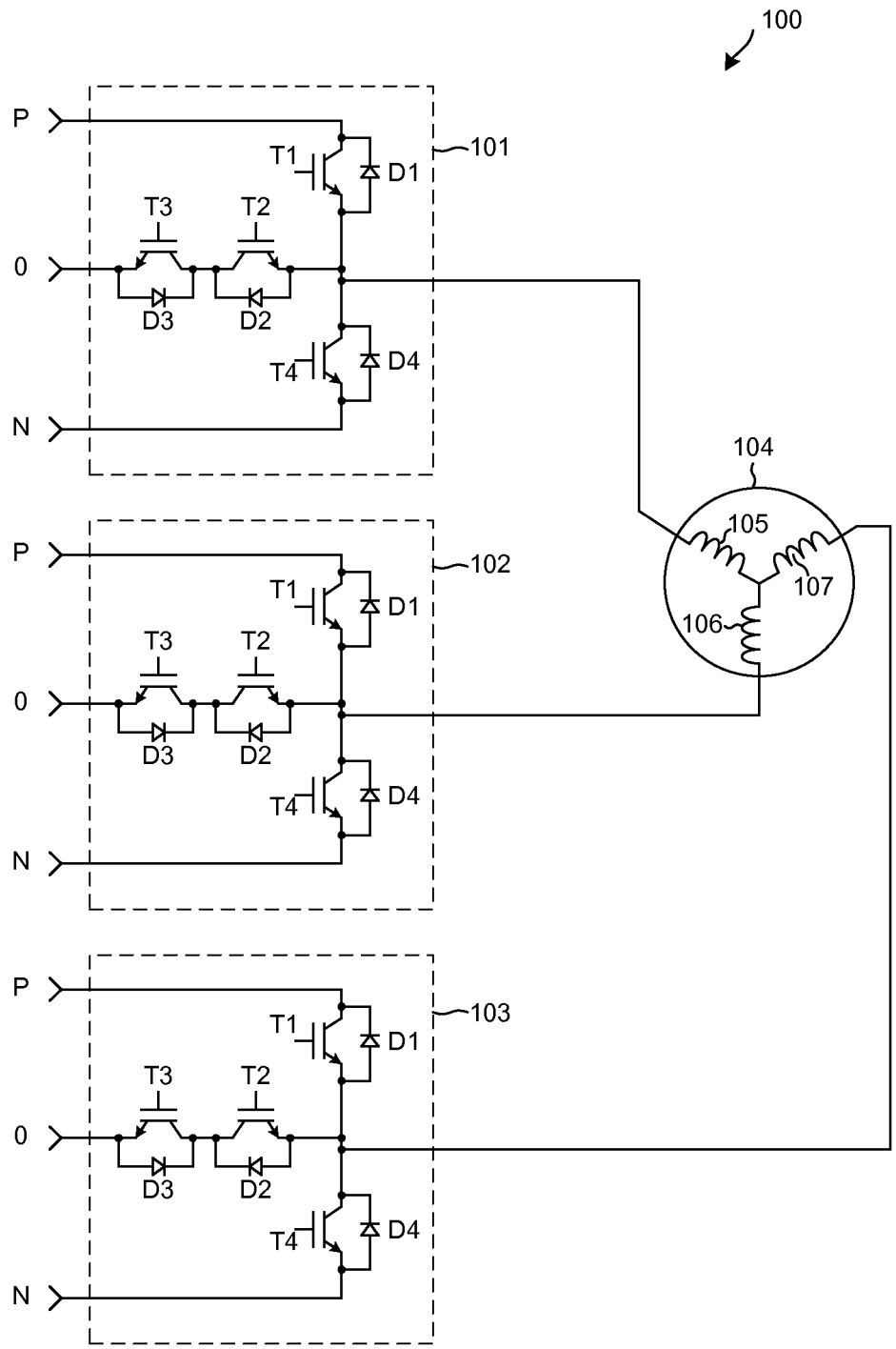
FIG. 9 is a circuit diagram of a system in which three instances of the assembly of FIG. 8 are used to drive a motor.

FIG. 9 is a circuit diagram of a system 100 involving three three-level NPC phase legs 101-103. The three phase legs drive an electric motor 104. Each of the three phase legs 101-103 is an instance of the assembly of FIG. 8, and is illustrated in simplified form as having one DC-link, even though it is understood the this DC-link is realized as two parallel-connected DC-links. The assembly of FIG. 8 involving modules 20 and 73 and bus bars 78 and 79 is the upper phase leg 101 in FIG. 9. Phase leg 101 is coupled to a first winding 105 of the motor. Phase leg 102 is coupled to a second winding 106 of the motor. Phase leg 103 is coupled to a third winding 107 of the motor. The P power terminals the three phase leg assemblies 101-103 are all connected together and to a common positive DC voltage (for example, +400V). The N power terminals of the three phase leg assemblies 101-103 are all connected together and to a common negative DC voltage (for example, −400V). The 0 bus bars of the three phase leg assemblies 101-103 are all connected together and to a common ground (zero volts). Although there may be six different bus bars in some embodiments, in other embodiments the "0V" bus bars are merged into a single "0V" bus bar that connects to all three phase legs. Likewise, there may be a single P bus bar that connected to the P power terminals of all three phase legs, and there may be a single N bus bar that connects to the N power terminals of all three phase legs. Control and driver circuitry (not shown) for driving the transistors of the three phase legs is known in the art and is not described here.

Although all of one T-type three-level NPC structure could be implemented in a single module package, in high power applications where thermal dissipation requirements are too great for a standard module package an undesired special non-standard module package would be required to house all the circuitry in a manner that could adequately dissipate heat. In one novel aspect, a small standard four power terminal module package (such as is shown in top-down perspective in FIG. 3) is used, and the DC-link of the overall T-type three-level NPC structure is split into two parts and is spread between the two small standard module packages. Each of the two parts of the DC-link has about half the power carrying capability as compared to a comparable design having only one DC-link. The IGBT and diode dice of the two parallel DC-link circuits can be made with smaller and can employ less costly power dice. As a result of this spread out dual DC-link circuitry, the needed thermal dissipation is achieved while at the same time use of a single standard module package is maintained. Manufacturing volumes of that one standard module package device are increased because all instances of the module package needed to realize the overall T-type three-level NPC circuit are instances of the same module part. This may have advantages in some manufacturing environments.

By turning module 73 of FIG. 8 one-hundred eighty degrees with respect to module 20, and by connecting the two modules together with bus bars 78 and 79 as illustrated in FIG. 8, two identical instances of the same module can be interconnected to form a T-type three-level NPC phase leg. Half of the DC-link is disposed in module 73 and the other half of the DC-link is disposed in module 20. By splitting the circuitry of a T-type three-level NPC circuit into two identical halves in this way, and by providing the AC power terminal of the DC-link half (the fourth power terminal of module 20) close to the AC power terminal of the main IGBT (close to the third power terminal of module 20) in each module, the area enclosed by main current and commutation current loops is reduced as compared to other multi-module realizations of T-type three-level NPC circuits. Note that the distance 81 between power terminals P3 and P4, and between power terminals P1 and P2, in FIG. 3 is the minimum separation allowed between power terminals for the particular design and voltage considerations. Due to the smaller current loops, stray inductance is reduced as compared to a multi-module realization that provides the DC-link and the main IGBTs in different modules. The use to two identical modules to realize the three-level NPC circuit, as compared to realizing the three-level NPC circuit using different types of modules, is advantageous in that fewer module types need to be manufactured and stocked. Higher manufacturing quantities helps reduce module unit manufacturing cost for overall the T-type NPC phase leg. In addition, the novel module may also see use in power circuits other than in a T-type NPC phase leg. Due to the use of the two parallel-connected DC-links in the three-level NPC circuit, power dissipation is spread into two modules as opposed to all power dissipation occurring in one module. Snubber circuits are therefore not necessary in some applications to spread power losses, whereas if a single DC-link were used in a standard module package then such snubber circuits would typically be required.

Figure 10:
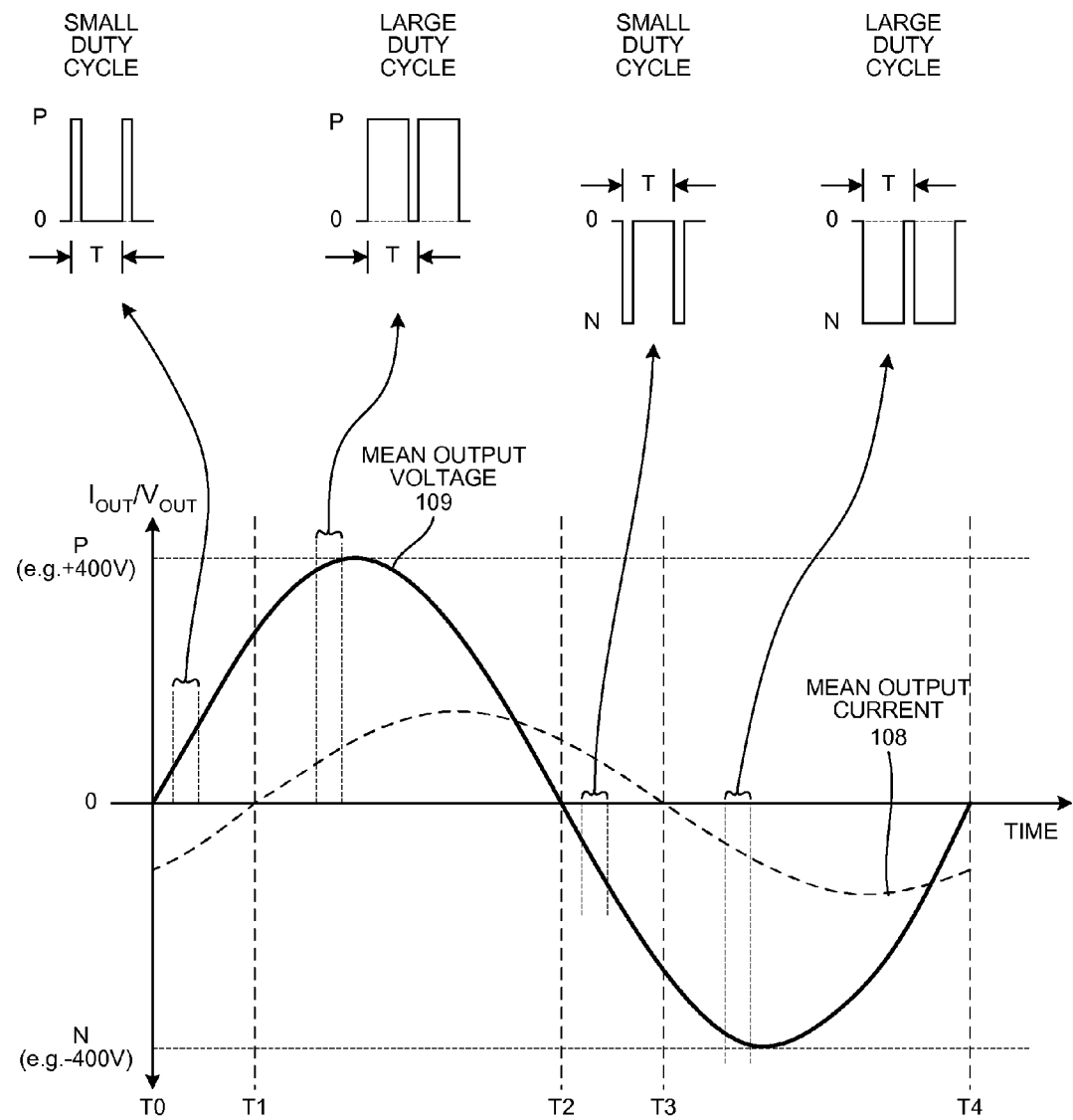
FIG. 10 is a waveform diagram that illustrates an operation of one of the phase legs of the system of FIG. 9.

FIG. 10 is a waveform diagram that illustrates operation of the system 100 of FIG. 9 in supplying a current waveform $I_{OUT}$ 108 out of the first phase leg circuit 101 and to the first winding 105 of the motor. $I_{OUT}$ waveform 108 represents the desired mean output current as supplied to winding 105. $V_{OUT}$ waveform 109 represents the desired mean output voltage as supplied to winding 105.

Between times T0 and T1, the output voltage is positive and the output current is negative. During this time, the IGBTs of the phase leg are controlled to cycle from the state illustrated in FIG. 12A, to the state illustrated in FIG. 12B, to the state illustrated in FIG. 12C, to the state illustrated in FIG. 12D, and then back to the state illustrated in FIG. 12A. The conditions of FIGS. 12B and 12D are maintained only for a relatively short dead time. The dead time may, for example, be 50 ns. The duty cycle during which current flows into the P terminal is pulse-width modulated so that the desired $I_{OUT}$ current waveform is achieved. The upper left detail of FIG. 10 shows how the duty cycle is small during this time. The period of the pulse-width modulation is, for example, 20 kHz. The voltage magnitude of the pulses is positive DC voltage P.

Figure 13A:
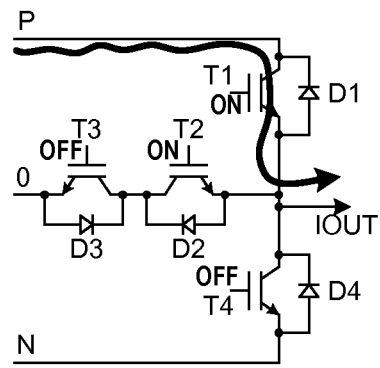
FIGS. 13A-13D are diagrams that illustrate how a phase leg of the system of FIG. 9 operates during time period T1-T2.
Figure 13B:
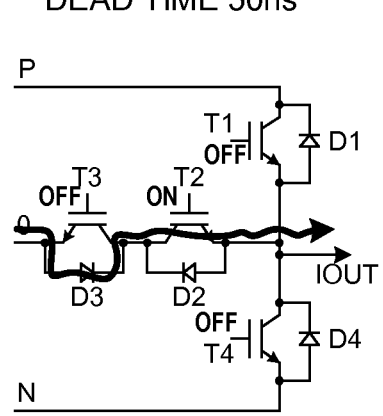
Figure 13C:
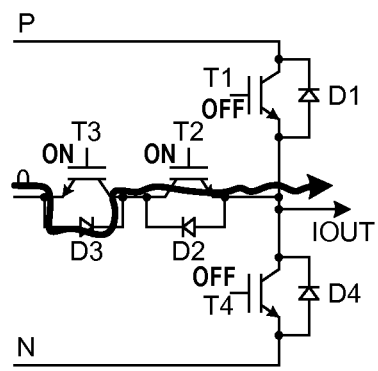
Figure 13D:
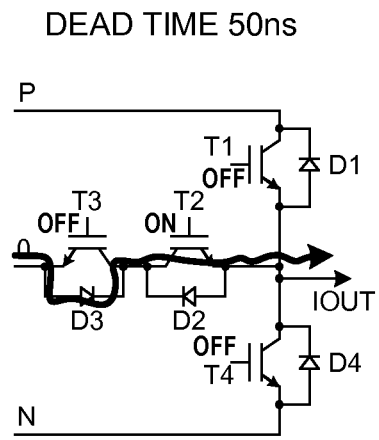

Between times T1 and T2, the output voltage is positive and the output current is also positive. During this time, the IGBTs of the phase leg are controlled to cycle through the states illustrated in FIGS. 13A, 13B, 13C and 13D. The conditions of FIGS. 13B and 13D are only maintained for the short dead time. The duty cycle during which current flows out of the P terminal is pulse-width modulated so that the desired IOUT current waveform is achieved. The detail of FIG. 10 that is second from the left shows how the duty cycle is large during this time. The voltage magnitude of the pulses is positive DC voltage P.

Figure 14A:
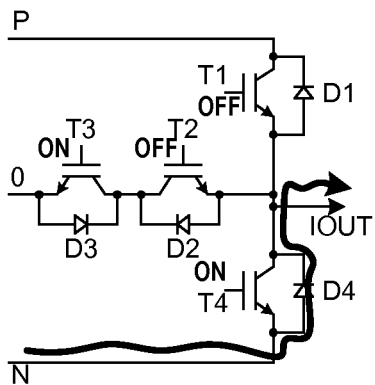
FIGS. 14A-14D are diagrams that illustrate how a phase leg of the system of FIG. 9 operates during time period T2-T3.
Figure 14B:
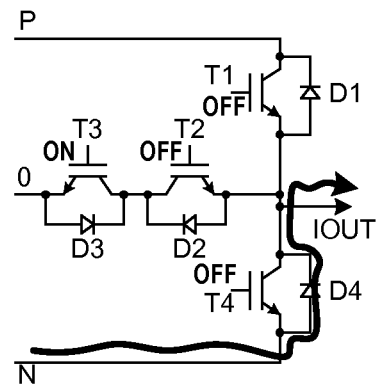
Figure 14C:
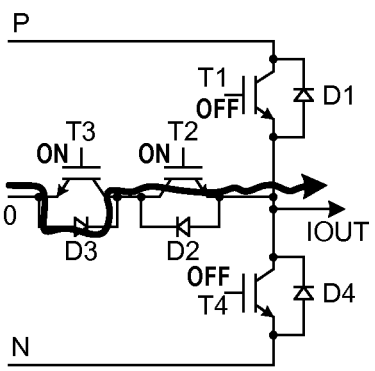
Figure 14D:
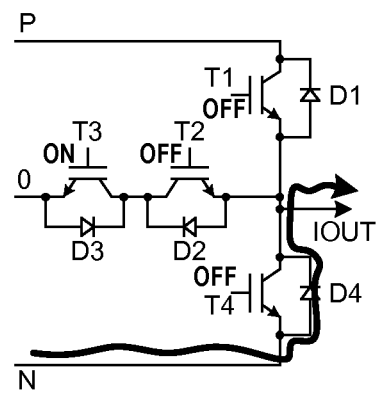

Between times T2 and T3, the output voltage is negative but the output current is positive. During this time, the IGBTs of the phase leg are controlled to cycle through the states illustrated in FIGS. 14A, 14B, 14C and 14D. The conditions of FIGS. 14B and 14D are only maintained for the short dead time. The duty cycle during which current flows out of the N terminal is pulse-width modulated so that the desired IOUT current waveform is achieved. The detail of FIG. 10 that is second from the right shows how the duty cycle is small during this time. The voltage magnitude of the pulses is negative DC voltage N.

Figure 15A:
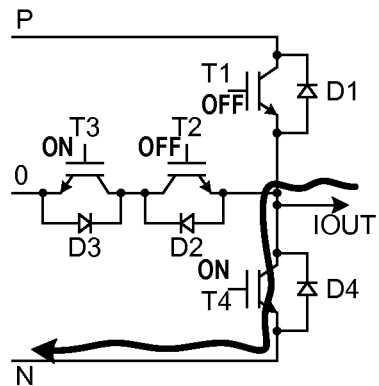
FIGS. 15A-15D are diagrams that illustrate how a phase leg of the system of FIG. 9 operates during time period T3-T4.
Figure 15B:
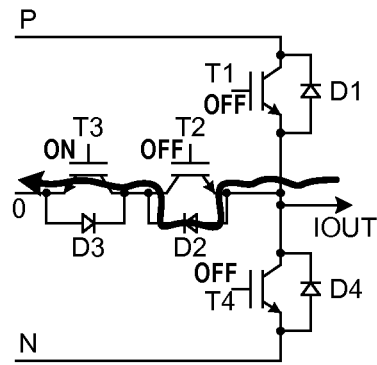
Figure 15C:
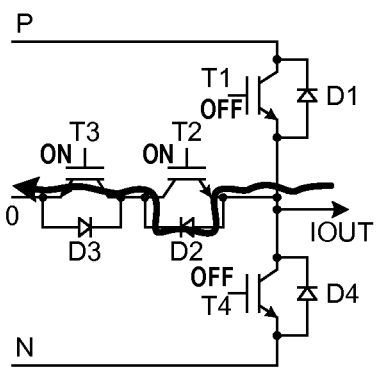
Figure 15D:
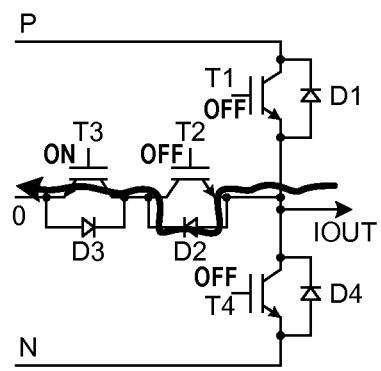

Between times T3 and T4, the output voltage is negative and the output current is also negative. During this time, the IGBTs of the phase leg are controlled to cycle through the states illustrated in FIGS. 15A, 15B, 15C and 15D. The conditions of FIGS. 15B and 15D are only maintained for the short dead time. The duty cycle during which current flows into the N terminal is pulse-width modulated so that the desired IOUT current waveform is achieved. The upper right detail of FIG. 10 shows how the duty cycle is large during this time. The voltage magnitude of the pulses is negative DC voltage N.

FIG. 11 is a table that shows, for the condition of each of FIGS. 12A-12D, 13A-13D, 14A-14D and 15A-15D: 1) whether each of the IGBTs T1-T4 of phase leg 101 is on or off, 2) whether current is flowing through each of the diodes D1-D4 of phase leg 101, and 3) whether current is flowing through each of the IGBTs T1-T4 of phase leg 101.

Figure 16:
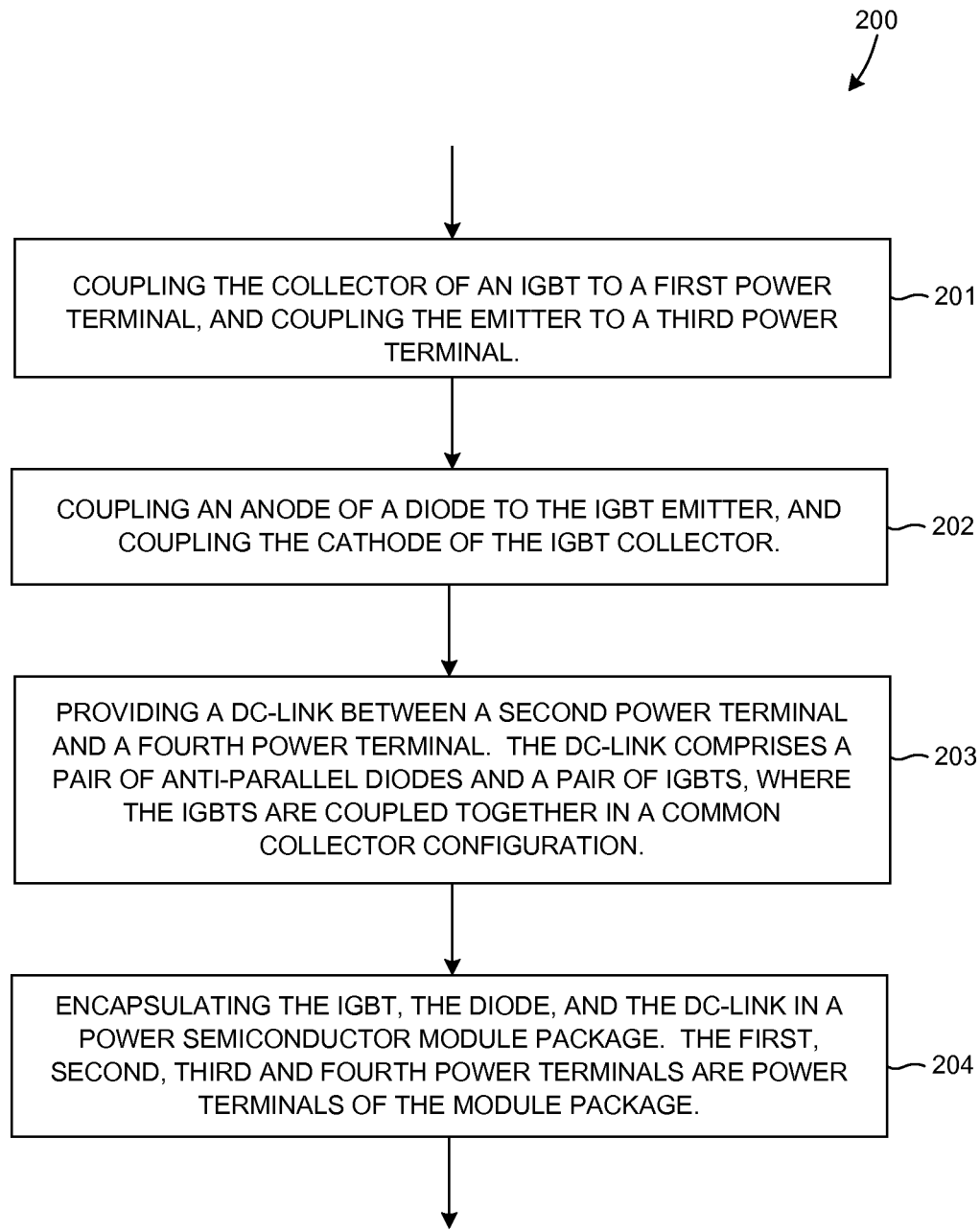
FIG. 16 is a flowchart of a method 200 in accordance with one novel aspect.

FIG. 16 is a flowchart of a method 200 in accordance with one novel aspect. In step 201, a collector of the IGBT is coupled to a first power terminal and an emitter of the IGBT is coupled to a third power terminal. In step 202, an anode of a diode is coupled to the emitter of the IGBT and a cathode of the diode is coupled to the collector of the IGBT. In step 203, a DC-link is provided between a second power terminal and a fourth power terminal. The DC-link comprises a pair of diodes and a pair of IGBTs, where the IGBTs are connected in a common collector configuration. In step 204, the IGBT, the diode, and the DC-link are encapsulated in a power semiconductor module package. The first, second, third and fourth power terminals are power terminals of the power semiconductor module package. The encapsulation may involve covering the DBC assembly in the enclosure portion of the housing with one or more layers of an encapsulant such as silicone gel, and then fixing the cap to the enclosure portion to close the enclosure portion. In one example, the steps of method 200 are performed by gluing or otherwise mounting a DBC substrate into the bottom of the enclosure portion of a housing, mounting the IGBTs T1-T3 and the diodes D1-D3 of the circuit of FIG. 4 onto the top of the DBC substrate, wire bonding the components together on the DBC, wire bonding the DBC assembly to power terminals of the module, encapsulating the DBC assembly into the enclosure portion of the housing, and then capping the enclosure portion to make the finished module of FIG. 3. The steps of the flowchart of FIG. 16 therefore do not need to be done one at a time, or in any particular sequence. In a further step, two such modules are assembled together with bus bars to form the structure of FIG. 8.

Although certain specific embodiments are described above for instructional purposes, the teachings of this patent document have general applicability and are not limited to the specific embodiments described above. Although a DC-link is described above that involves IGBTs coupled together in a common collector configuration, the DC-link may also be implemented using IGBTs in a common emitter configuration, with fast recovery anti-parallel diodes. Alternatively, a DC-link can be implemented using two reverse blocking IGBTs coupled together in parallel. The teachings set forth above can be applied to T-type NPC circuits that use field effect transistors and bipolar transistors rather than IGBTs. Accordingly, various modifications, adaptations, and combinations of various features of the described embodiments can be practiced without departing from the scope of the invention as set forth in the claims.

What is claimed is:

1. An assembly comprising:
(a) a first power semiconductor device module comprising:
a first housing having a first enclosure portion;
a first power terminal having a fastening hole;
a second power terminal having a fastening hole, wherein the first and second power terminals are disposed along a first line;
a third power terminal having a fastening hole;
a fourth power terminal having a fastening hole, wherein the first and second power terminals are disposed along a second line, wherein the second line is parallel to the first line;
a first (Insulated Gate Bipolar Transistor) IGBT having a collector coupled to the first power terminal and having an emitter coupled to the third power terminal;
a first recovery diode having an anode coupled to the emitter of the first IGBT and having a cathode coupled to the collector of the first IGBT;
a second IGBT having a collector and having an emitter coupled to the fourth power terminal;
a second recovery diode having a cathode coupled to the collector of the second IGBT and having an anode coupled to the emitter of the second IGBT;
a third IGBT having a collector coupled to the collector of the second IGBT and having an emitter coupled to the second power terminal;
a third recovery diode having an anode coupled to the emitter of the third IGBT and having a cathode coupled to the collector of the third IGBT; and
a first substrate disposed in the first enclosure portion, wherein at least one of the first, second and third IGBTs is disposed on the first substrate, wherein the first, second and third IGBTs are disposed in the first enclosure portion, and wherein the first, second and third recovery diodes are disposed in the first enclosure portion;
(b) a second power semiconductor device module comprising:
a second housing having a second enclosure portion;
a fifth power terminal having a fastening hole;
a sixth power terminal having a fastening hole, wherein the fifth and sixth power terminals are disposed along the second line;
a seventh power terminal having a fastening hole;
an eighth power terminal having a fastening hole, wherein the seventh and eighth power terminals are disposed along the first line;
a fourth IGBT having an emitter coupled to the seventh power terminal and having a collector coupled to the fifth power terminal;
a fourth recovery diode having an anode coupled to the emitter of the fourth IGBT and having a cathode coupled to the collector of the fourth IGBT;
a fifth IGBT having a collector and having an emitter coupled to the eighth power terminal;
a fifth recovery diode having an anode coupled to the emitter of the fifth IGBT and having a cathode coupled to the collector of the fifth IGBT;
a sixth IGBT having a collector coupled to the collector of the fifth IGBT and having an emitter coupled to the sixth power terminal;
a sixth recovery diode having an anode coupled to the emitter of the sixth IGBT and having a cathode coupled to the collector of the sixth IGBT; and
a second substrate disposed in the second enclosure portion, wherein at least one of the fourth, fifth and sixth IGBTs is disposed on the second substrate, wherein the fourth, fifth, and sixth transistors are disclosed in the second enclosure portion, and wherein the fourth, fifth and sixth recovery diodes are disposed in the second enclosure portion;
(c) a first conductive member coupled to the second power terminal of the first power semiconductor device module and to the eighth power terminal of the second power semiconductor device; and
(d) a second conductive member coupled to the third and fourth power terminals of the first power semiconductor device module and to the fifth and sixth power terminals of the second power semiconductor device module.

2. The assembly of claim 1, wherein the first a third power terminals are disposed along a third line, wherein the second and fourth power terminals are disposed along a fourth line, wherein the third line is parallel to the fourth line, and wherein the second line is perpendicular to the first line.

3. The assembly of claim 1, wherein the first and second power semiconductor device modules are of substantially identical construction.

4. The assembly of claim 1, wherein the first power semiconductor device has no more than four power terminals that have fastening holes, and wherein the second power semiconductor device has no more than four power terminals that have fastening holes.

5. The assembly of claim 1, wherein a current passing from the first power terminal to the third power terminal passes through one and only one IGBT, and wherein a current passing from the third power terminal to the first power terminal passes through one and only one diode.

6. The assembly of claim 1, wherein a current passing from the second power terminal to the fourth power terminal passes through one and only one diode and one and only one IGBT, and wherein a current passing from the fourth power terminal to the second power terminal passes through one and only one diode and one and only one IGBT.

7. The assembly of claim 1, wherein a first conductive connection is coupled to the emitter of the first IGBT, wherein a second conductive connection makes electrical connection to a gate of the first IGBT, and wherein the first and second conductive connections extends for a distance in a twisted fashion with respect to one another.

8. The assembly of claim 7, wherein the first conductive connection bridges over the second conductive connection.

9. A power semiconductor device module comprising:
a housing having an enclosure portion;
a first power terminal having a fastening hole;
a second power terminal having a fastening hole, wherein the first and second power terminals are disposed along a first line;
a third power terminal having a fastening hole;
a fourth power terminal having a fastening hole, wherein the third and fourth power terminals are disposed along a second line, wherein the second line is parallel to the first line;
a first (Insulated Gate Bipolar Transistor) IGBT having a collector coupled to the first power terminal and having an emitter coupled to the third power terminal;
a first recovery diode having an anode coupled to the emitter of the first IGBT and having a cathode coupled to the collector of the first IGBT;
a second IGBT having a collector and having an emitter coupled to the fourth power terminal;
a second recovery diode having a cathode coupled to the collector of the second IGBT and having an anode coupled to the emitter of the second IGBT;
a third IGBT having a collector coupled to the collector of the second IGBT and having an emitter coupled to the second power terminal;
a third recovery diode having an anode coupled to the emitter of the third IGBT and having a cathode coupled to the collector of the third IGBT; and
a substrate disposed in the enclosure portion, wherein at least one of the first, second and third IGBTs is disposed on the substrate, wherein the first, second and third IGBTs are disposed in the enclosure portion, and wherein the first, second and third recovery diodes are disposed in the enclosure portion.

10. The power semiconductor device module of claim 9, wherein a current passing from the first power terminal to the third power terminal passes through at most one transistor, wherein a current passing from the third power terminal to the first power terminal passes through at most one diode and passes through no transistor, wherein a current passing from the second power terminal to the fourth power terminal passes through at most one transistor and at most one diode, and wherein a current passing from the fourth power terminal to the second power terminal passes through at most one transistor and at most one diode.

11. A circuit comprising:
a positive DC voltage conductor;
a negative DC voltage conductor;
a zero voltage DC voltage conductor;
an output conductor;
a first (Insulated Gate Bipolar Transistor) IGBT having a collector coupled to the positive DC voltage conductor and having an emitter coupled to the output conductor;
a first recovery diode having an anode coupled to the emitter of the first IGBT and having a cathode coupled to the collector of the first IGBT;
a first DC-link coupled between the zero voltage DC conductor and the output conductor, wherein the first DC-link comprises a first pair of IGBTs coupled together in a common collector configuration;
a second DC-link coupled between the zero voltage DC conductor and the output conductor, wherein the second DC-link comprises a second pair of IGBTs coupled together in a common collector configuration;
a second IGBT having a collector coupled to the output conductor and having an emitter coupled to the negative DC voltage conductor; and
a second recovery diode having an anode coupled to the emitter of the second IGBT and having a cathode coupled to the collector of the second IGBT.

12. The circuit of claim 11, wherein the first IGBT is coupled to the output conductor via a first module terminal, wherein the first DC-link is coupled to the output conductor via a second module terminal, wherein the second DC-link is coupled to the output conductor via a third module terminal, and wherein the second IGBT is coupled to the output conductor via a fourth module terminal.

13. The circuit of claim 12, wherein the output conductor is a bus bar.

14. The circuit of claim 13, wherein the first, second, third and fourth module terminals are disposed in a line.

15. The circuit of claim 11, wherein the circuit comprises two substantially identical power modules, wherein the first IGBT and the first DC-link are parts of the one of the power modules, and wherein the second IGBT and the second DC-link are parts of the other of the power modules.

16. A method of manufacture, comprising:
coupling a collector of a first Insulated Gate Bipolar Transistor (IGBT) to a first power terminal;
coupling an emitter of the first IGBT to a third power terminal;
coupling an anode of a first diode to the emitter of the first IGBT;
coupling a cathode of the first diode to the collector of the first IGBT;
providing a DC-link between a second power terminal and a fourth power terminal, wherein the DC-link comprises the first IGBT and a second IGBT coupled together in a common collector configuration, wherein an emitter of the second IGBT is coupled to the fourth power terminal, wherein the first and second power terminals are disposed along a first line, wherein the first and second power terminals are disposed along a second line, wherein the second line is parallel to the first line; and wherein each of the first, second, third and fourth power terminals has a fastening hole;

coupling an anode of a second diode to the emitter of the second IGBT;

coupling a cathode of the second diode to a collector of the second IGBT;

coupling a collector of a third IGBT to the collector of the second IGBT;

coupling an emitter of the third IGBT to the second power terminal;

coupling an anode of a third diode to the emitter of the third IGBT;

coupling a cathode of the third diode to a collector of the third IGBT;

mounting the first, second and third IGBTs on a substrate; and encapsulating the first, second and third IGBTs, the first second and third diodes, and the DC-link in a first power semiconductor module package, wherein the first, second, third and fourth power terminals are terminals of the first power semiconductor module package, and wherein the substrate is a part of the first power semiconductor module package.

17. The method of claim 16, wherein the first power semiconductor module package is substantially identical to a second power semiconductor module package, wherein the second power semiconductor module package has a first power terminal, a second power terminal, a third power terminal and a fourth power terminal, the method further comprising:

coupling the third and fourth power terminals of the first power semiconductor module package to the first and second power terminals of the second power semiconductor module package; and coupling the second power terminal of the first power semiconductor module package to the fourth power terminal of the second power semiconductor module package.

\* \* \* \* \*